(12) United States Patent
Son et al.

(10) Patent No.: US 7,190,012 B2
(45) Date of Patent: Mar. 13, 2007

(54) PHOTODIODE AND METHOD OF MANUFACTURING THE SAME

(75) Inventors: Ho-Sung Son, Hwaseong-si (KR); Sung-Ryoul Bae, Suwon-si (KR); Dong-Kyun Nam, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 11/002,832

(22) Filed: Dec. 2, 2004

(65) Prior Publication Data
US 2005/0133838 A1 Jun. 23, 2005

(30) Foreign Application Priority Data
Dec. 17, 2003 (KR) ................. 10-2003-0092584

(51) Int. Cl.
 H01L 31/062 (2006.01)
 H01L 31/113 (2006.01)
(52) U.S. Cl. .................. 257/292; 257/290; 257/291; 257/E27.13; 257/E27.133; 257/E27.135
(58) Field of Classification Search ........ 257/E33.076, 257/E27.13, E27.133, E27.135, 184–186, 257/291–293, 233
See application file for complete search history.

(56) References Cited

U.S. PATENT DOCUMENTS 6,521,920 B2 * 2/2003 Abe ........................... 257/223
6,525,351 B2 * 2/2003 Yoshida ....................... 257/229
6,677,627 B2 * 1/2004 Miida ......................... 257/292
6,809,359 B2 * 10/2004 Yamada ....................... 257/292

FOREIGN PATENT DOCUMENTS

| JP | 2002-190587 | 7/2002 |
| JP | 2003-163344 | 6/2003 |
| KR | P1993-0011308 | 6/1993 |
| KR | 2003-002018 | 1/2003 |

\* cited by examiner

*Primary Examiner*—Kenneth Parker
*Assistant Examiner*—Jesse A. Fenty
(74) *Attorney, Agent, or Firm*—F. Chau & Associates, LLC

(57) ABSTRACT

A photodiode and a method of manufacturing the photodiode are provided. The method includes forming a diode junction structure including a light receiving unit and an electrode unit on a semiconductor substrate, forming a buffer oxide layer and an etching blocking layer on the junction structure, forming an interlayer insulating layer and an intermetal insulating layer and an interconnecting structure, exposing the etching blocking layer by etching the intermetal insulating layer and the interlayer insulating layer, removing a portion of the etching blocking layer and the buffer oxide layer of the light-receiving unit by dry etching, and exposing a semiconductor surface of the light-receiving unit by wet etching.

8 Claims, 17 Drawing Sheets

PHOTODIODE AND METHOD OF MANUFACTURING THE SAME

BACKGROUND OF THE INVENTION

1. Field of the Invention

The present invention relates to a semiconductor device and a method of manufacturing the same, and more particularly, to a photodiode for converting optical signals into electrical signals and a method of manufacturing the photodiode.

2. Description of the Related Art

Typically, a photodiode for use with an optical element is an optical senor that produces an electrical signal (e.g., a current or voltage) in response to an optical signal by converting optical energy into electrical energy. A photodiode is a diode in which a junction unit thereof has an optical detection function. A photodiode utilizes the principle that excessive electrons or holes, which are generated by photon absorption, modulate the conductivity of the photodiode. That is, the electric current produced by a photodiode varies according to the generation of carriers in response to incident photons, thus providing a useful method for converting optical signals into electrical signals. In use, a photodiode can function as an interface, which reads and writes data stored in an optical disk or which transmits signals to a servo by converting optical signals into electrical signals.

Examples of photodiodes having an optical detection function include a photodiode having a P-N junction structure, a P type electrode—intrinsic epitaxial layer—N+ type layer—P substrate (PIN) photodiode, an N type electrode—epitaxial layer—P+ type layer—P substrate (NIP) photodiode, and an avalanche photodiode (APD), which uses an avalanche breeding effect. An 'I' region of an NIP or PIN photodiode, which can be an intrinsic semiconductor region, has a high resistance, can be composed of a material other than a true intrinsic semiconductor, and controls the width of a depletion region. Such photodiodes are widely used in CD, DVD, DVD R/W, COMBO, COMBI, Blue ray drives, etc.

The performance of a photodiode is evaluated by its photoefficiency and frequency characteristics (e.g., bandwidth). A photodiode can achieve a high performance if it has a high photoelectric efficiency at wavelengths of detected light and a sufficient response speed. Currently, research is under way for improving the performance of photodiodes. For example, in order to improve the photoefficiency of light having a desired wavelength, the reflection of light projected into a light-receiving unit of a photodiode must be prevented. To do this, an anti-reflective coating (ARC) can be formed on the upper surface of a light-receiving unit of a photodiode. The type and thickness of the ARC may be selected by taking into account the wavelength and the amount of light projected into the light-receiving unit. For example, a silicon nitride layer (SiN) or stacked layers of a silicon oxide layer/silicon nitride layer ($SiO_2$/SiN) may be used as the ARC. Examples of semiconductor devices including a photodiode with an $SiO_2$/SiN structured ARC are disclosed in Japanese Patent Publication Nos. 2003-163344 and 2003-110098.

Before an ARC is formed, however, a semiconductor surface of a light-receiving unit of a photodiode is exposed by selectively removing an interlayer insulating layer and an intermetal insulating layer of the light-receiving unit by etching. This process inevitably results in over etching the semiconductor surface because the thicknesses of an interlayer insulating layer and an intermetal insulating layer are not uniform on a semiconductor wafer where the ARC is being formed. This over etching damages the semiconductor surface, thus increasing a leakage current of the photodiode.

FIG. 1 is a sectional view of a conventional NIP photodiode. Referring to FIG. 1, a P type buried layer 102, a P type epitaxial layer 103, an N type epitaxial layer 105, and an N+ type high density doping layer 108 are sequentially formed on a P type semiconductor substrate 101. A P type first junction region 104 and a P type second junction region 106 are respectively formed on the P type epitaxial layer 103 and the N type epitaxial layer 105. Also, a P+ type layer 109b is formed in the P type second junction region 106, and is in contact with a metal contact plug 113a of an anode electrode. A P+ type dividing layer 109a is formed on the N type epitaxial layer 105 to divide a light receiving unit of a photodiode. Metal interconnecting structures 113a, 113b, 115a, and 115b, including an anode electrode, are insulated by an interlayer insulating layer 112 and an intermetal insulating layer 114. A device isolating layer 107 is formed, for example by local oxidation of silicon (LOCOS) to separate a photodiode from neighboring elements. An $SiO_2$ layer 120a and an SiN layer 120b form an ARC 120 for blocking the reflection of projected light on the surface of the photodiode. The NIP photodiode includes a light-receiving unit that functions as a window through which light enters.

FIGS. 2 through 7 are sectional views illustrating a method of manufacturing a conventional NIP photodiode. First, as shown in FIG. 2, a P type high density doping buried layer 102 is formed on a P type semiconductor substrate 101, for example a P type silicon substrate, and a P type epitaxial layer 103 is formed on the P type buried layer 102. Then, a P type first junction region 104 is formed in the P type epitaxial layer 103. Next, an N type epitaxial layer 105 and a P type second junction region 106 are formed on the P type epitaxial layer 103 and P type first junction region 104, respectively. Then, a device isolating layer 107 and an N+ type layer 108 for contacting a cathode are formed on the N type epitaxial layer 105. A P+ type layer 109b for contacting an anode and a P+ type layer 109a for dividing a light receiving unit are formed in the P type second junction region 106.

Next, referring to FIG. 3, an interlayer insulating layer 112 is deposited on the resultant structure and a contact hole 112a exposing the P+ type layer 109b is formed by a photo etching process. Then, referring to FIG. 4, metal is deposited to fill the contact hole 112a. Then, a contact plug 113a and a first metal interconnecting layer 113b are formed by photo etching and an intermetal insulating layer 114 is deposited on the resultant structure. Then, referring to FIG. 5, a via 115a and a second metal interconnecting layer 115b are formed on the intermetal insulating layer 114 and the first metal interconnecting layer 113b.

Referring to FIG. 6, a photo-resist pattern 150 is then formed on the resultant material to open a light-receiving unit. The semiconductor surface of the light-receiving unit is exposed by selectively etching the interlayer insulating layer 112 and the intermetal insulating layer 114 using the photo-resist pattern 150 as an etching mask. Thus, the N+ type layer 108 and the P+ type layer 109a are exposed in the light-receiving unit. During this process, over-etching the exposed semiconductor surface of the light-receiving unit may occur because the thicknesses of the interlayer insulating layer 112 and the intermetal insulating layer 114 are not uniform over the entire wafer. Thus, when a dry etching is used, the exposed semiconductor surface may be damaged. Finally, as shown in FIG. 7, an ARC 120 including an $SiO_2$ layer 120a and an SiN 120b layer is deposited on the entire surface of the resultant structure.

Therefore because, over etching damages a semiconductor surface the amount of leakage current in a photodiode increases making it difficult for the photodiode to detect an optical signal and thus have high performance characteristics.

SUMMARY OF THE INVENTION

According to an aspect of the present invention, there is provided a method of manufacturing a photodiode, the method including: forming a buried layer of a first conductive type and a first epitaxial layer of the first conductive type on a semiconductor substrate and then forming a first junction region of the first conductive type in the first epitaxial layer; forming a second epitaxial layer of a second conductive type on the first epitaxial layer and then forming a second junction region of the first conductive type in contact with the first junction region and extending through the second epitaxial layer; forming a first high density doping layer of the second conductive type on the second epitaxial layer; forming a second high density doping layer of the first conductive type in the second junction region; sequentially forming a buffer oxide layer and an etching blocking layer on the second epitaxial layer; forming an interlayer insulating layer on the etching blocking layer and forming a first interconnecting structure in contact with the second high density doping layer on the second junction region; forming an intermetal insulating layer on the interlayer insulating layer and then forming a second interconnecting structure on the first interconnecting structure; exposing the etching blocking layer by selectively etching the intermetal insulating layer and the interlayer insulating layer to form a light-receiving unit; removing a portion of the etching blocking layer and the buffer oxide layer of the light-receiving unit by dry etching; and exposing a semiconductor surface of the light-receiving unit by removing the buffer oxide layer remaining in the light-receiving unit by wet etching.

The method may further include forming an anti-reflective coating (ARC) on the exposed semiconductor surface, the intermetal insulating layer, and the second interconnecting structure after exposing the semiconductor surface of the light-receiving unit. The ARC may be formed by sequentially depositing a silicon nitride layer (SiN) and a silicon oxide layer (SiO$_2$).

The method may further include forming a third high density doping layer of the first conductive type for dividing a light-receiving unit of the photodiode on the second epitaxial layer after forming the first high density doping layer of the second conductive type on the upper part of the second epitaxial layer. Also, the method may further include forming an element separating layer to separate the photodiode from other elements after forming the second junction region.

The step of exposing the etching blocking layer comprises removing a portion of the intermetal insulating layer and the interlayer insulating layer by wet etching and removing the interlayer insulating layer remaining by dry etching. Also, the step of exposing the etching blocking layer comprises removing the intermetal insulating layer and the interlayer insulating layer by dry etching.

According to another aspect of the present invention, there is provided a photodiode including: a buried layer of a first conductive type sequentially formed on a semiconductor substrate, a first epitaxial layer of the first conductive type formed on the buried layer, a second epitaxial layer of a second conductive type formed on the first epitaxial layer, a first junction region of a first conductive type in the first epitaxial layer, a second junction region of the first conductive type in contact with the first junction region and extending through the second epitaxial layer, a first high density doping layer of the second conductive type formed on the second epitaxial layer, a second high density doping layer of the first conductive type formed in the second junction region, an interlayer insulating layer formed on the second epitaxial layer, an intermetal insulating layer formed on the interlayer insulating layer to open a light-receiving unit, an interconnecting structure formed in the interlayer insulating layer and the intermetal insulating layer and in contact with the second high density doping layer, a buffer oxide layer formed on a portion of the second junction region outside the light-receiving unit, an etching blocking layer formed on the buffer oxide layer, and an ARC formed on the exposed semiconductor surface of the light-receiving unit, the intermetal insulating layer and the interconnecting structure.

The photodiode may further include a third high density doping layer of the first conductive type on the second epitaxial layer for dividing a light-receiving unit of the photodiode. The photodiode may further include a device isolating layer for isolating the photodiode from other elements. The ARC may be formed by sequentially depositing SiO$_2$ and SiN.

DETAILED DESCRIPTION OF THE INVENTION

Figure 1:
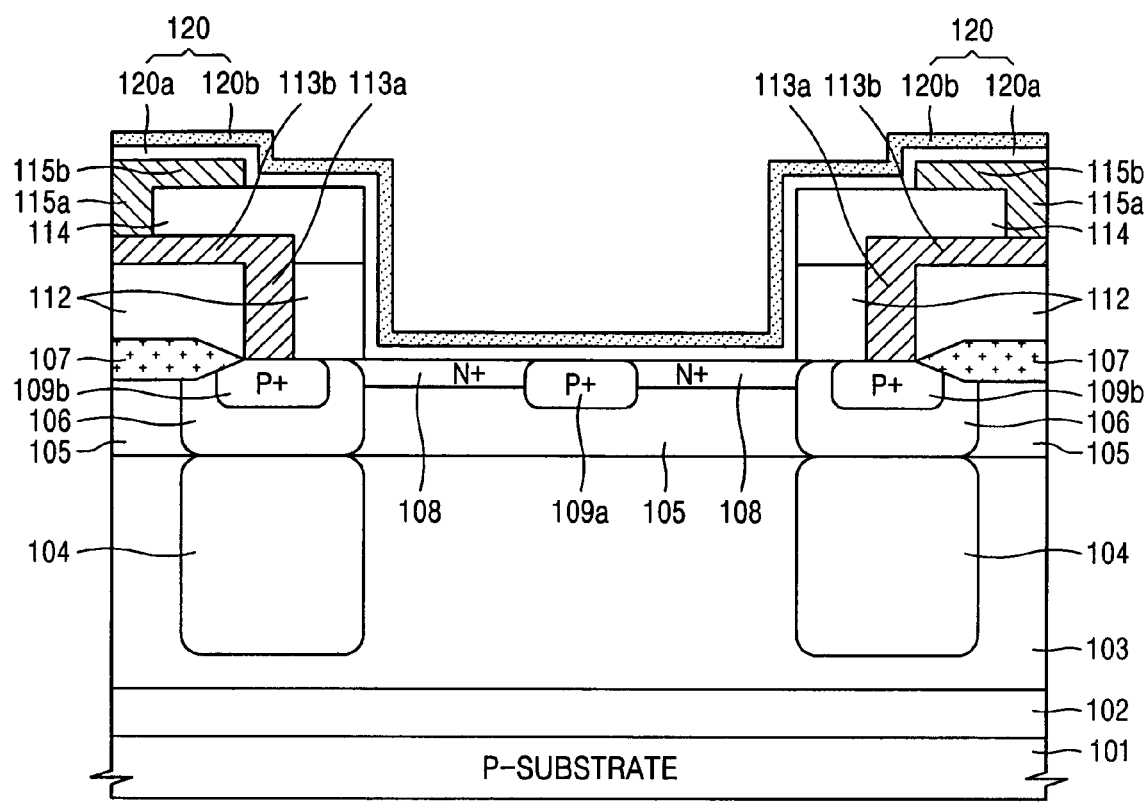
FIG. 1 is a sectional view of a conventional N type electrode—epitaxial layer—P+ type layer—P substrate (NIP) photodiode.
Figure 2:
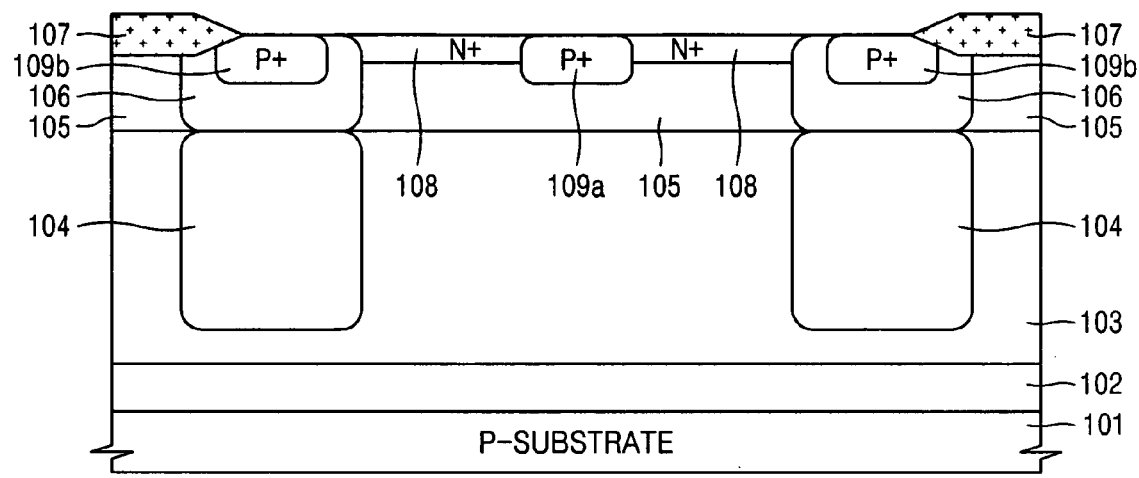
FIGS. 2 through 7 are sectional views illustrating a method of manufacturing the conventional NIP photodiode.
Figure 3:
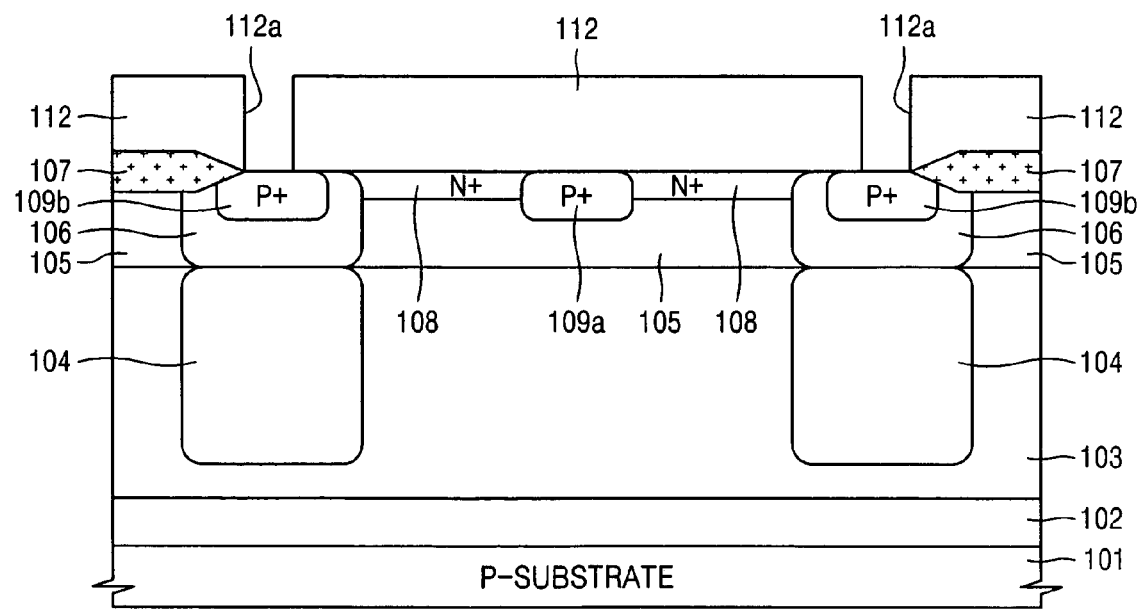
Figure 4:
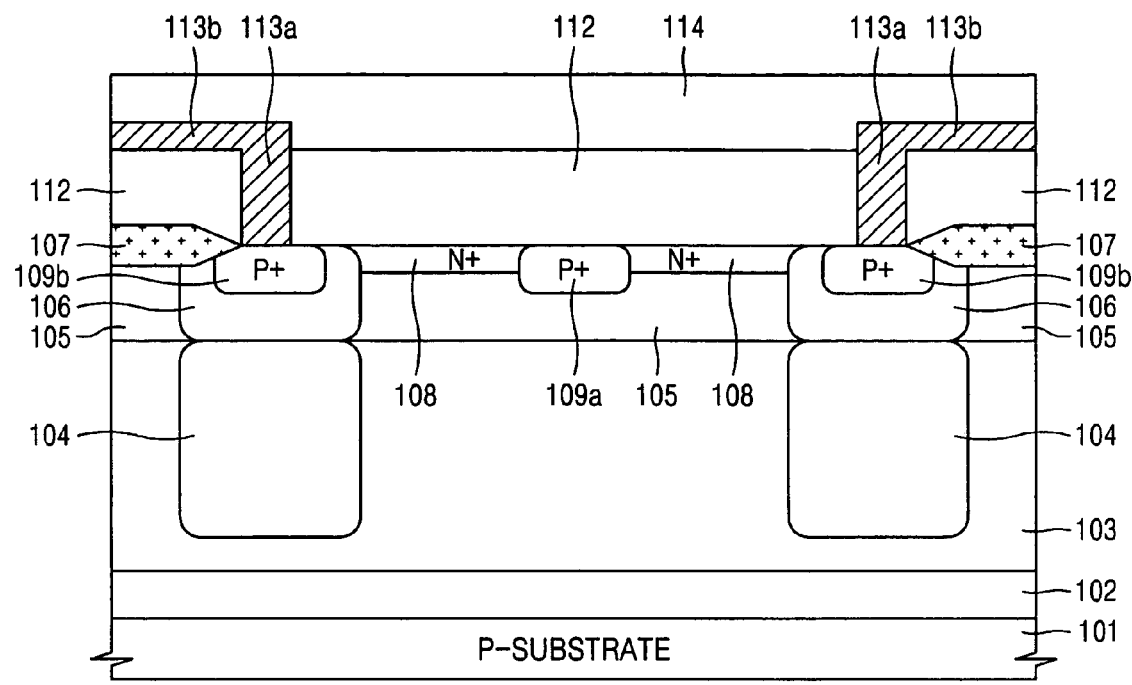
Figure 5:
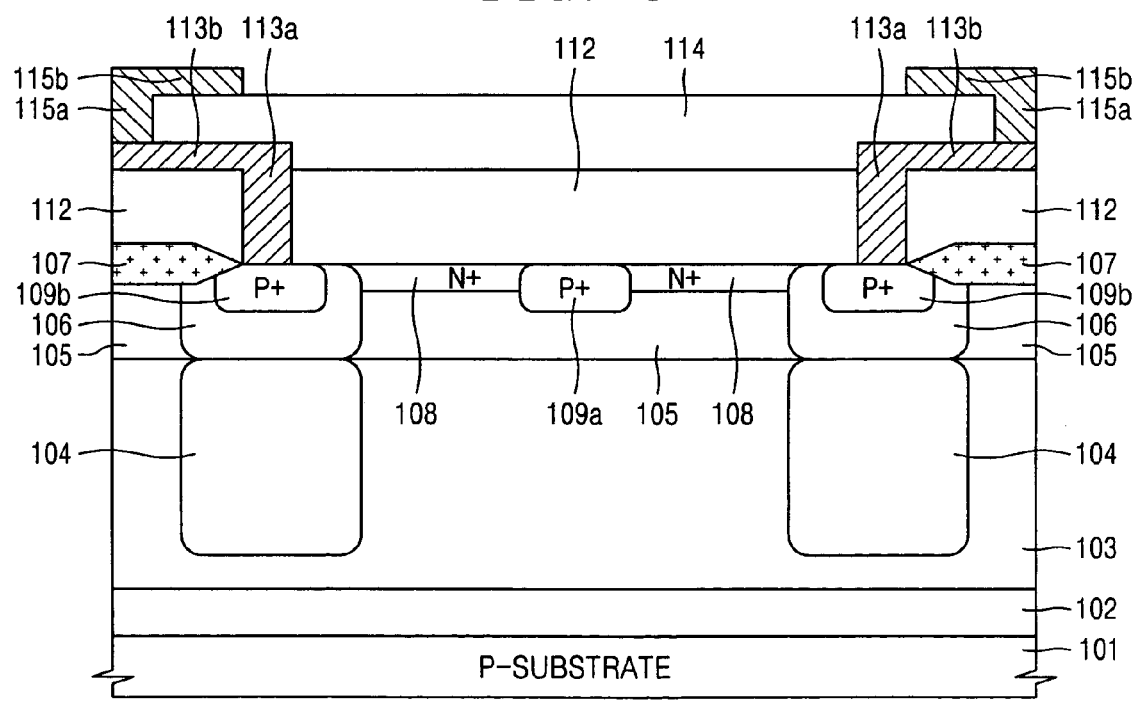
Figure 6:
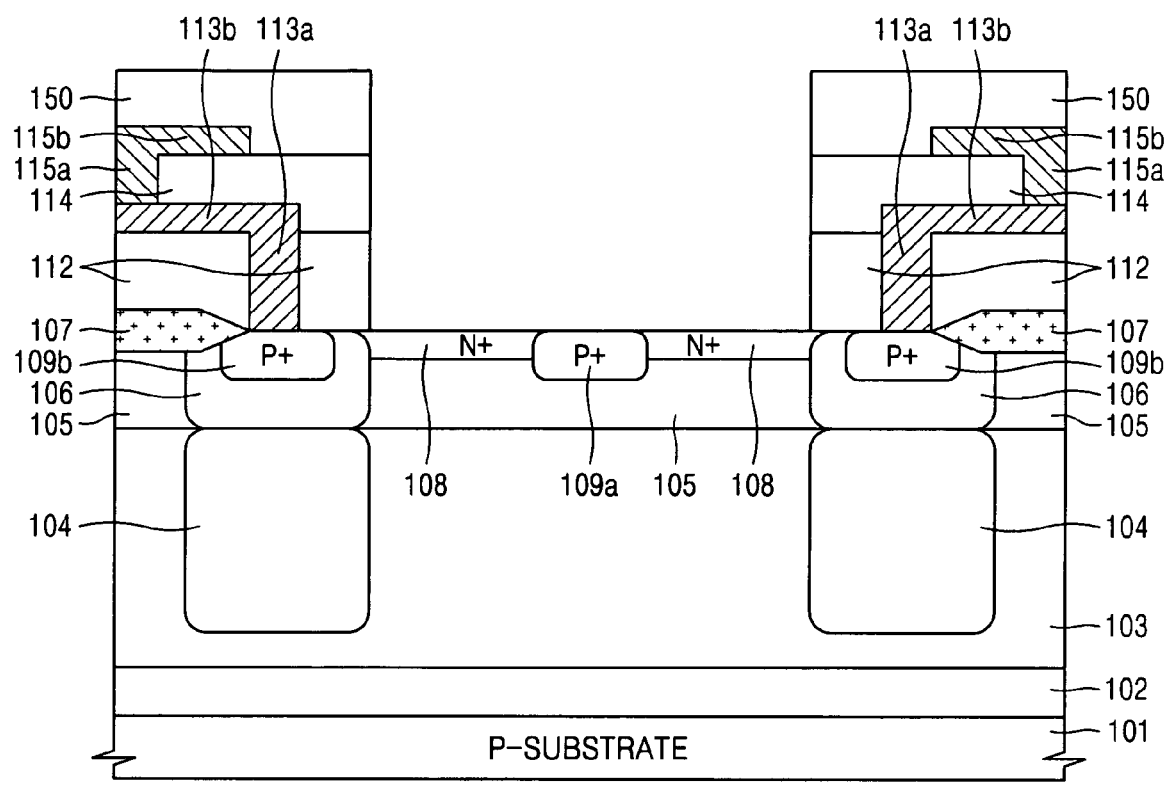
Figure 7:
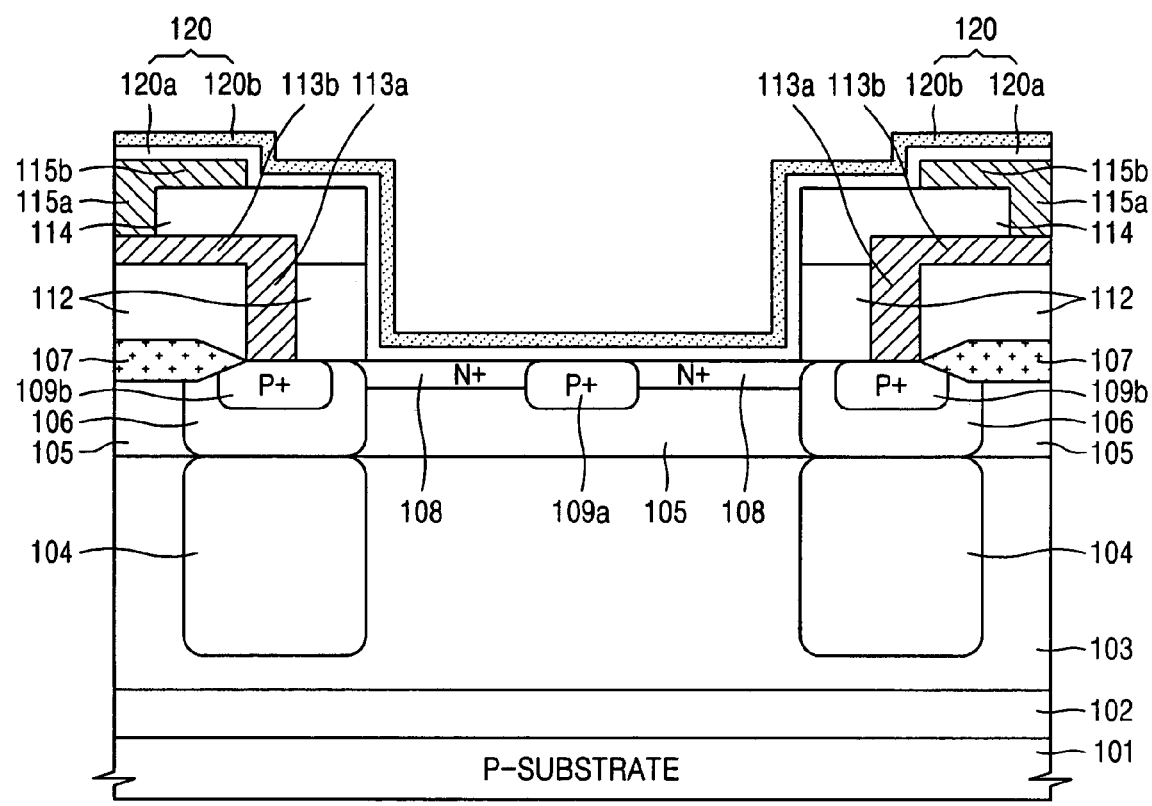
Figure 8:
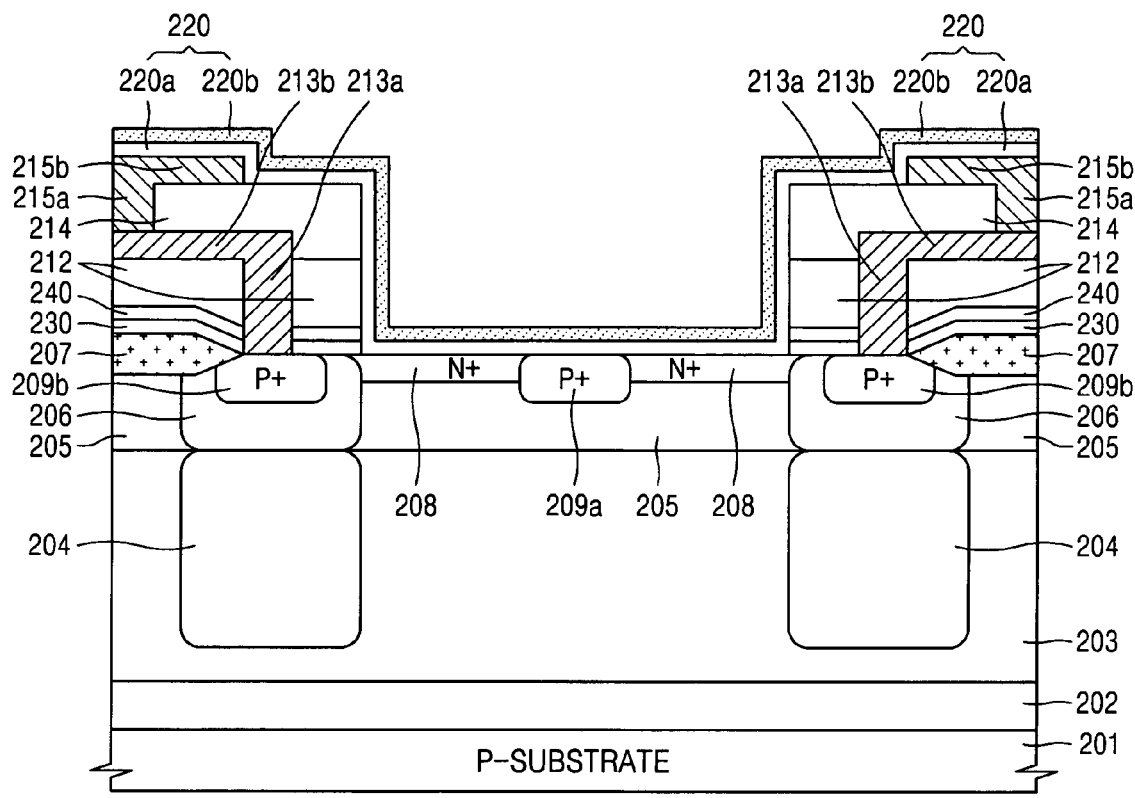
FIG. 8 is a sectional view of a photodiode according to an exemplary embodiment of the present invention.

FIG. 8 is a sectional view of an N type electrode—epitaxial layer—P+ type layer—P substrate (NIP) photodiode according to an exemplary embodiment of the present invention.

Referring to FIG. 8, a high density P type buried layer 202, a P type first epitaxial layer 203, and an N type second epitaxial layer 205 are sequentially formed on a P type semiconductor substrate 201. The first epitaxial layer 203 and the second epitaxial layer 205 constitute an 'I' region, which is a high resistivity intrinsic epitaxial layer region of an NIP photodiode. The I region generates an electron-hole pair when light is absorbed. A P type first junction region 204 and a P type second junction region 206 are formed in contact with each other in the first epitaxial layer 203 and the second epitaxial layer 205, respectively. The first junction region 204 and the second junction region 206 provide an electric current path through which current carriers generated in the first epitaxial layer 203 and the second epitaxial layer 205 can flow.

A first N+ type high density doping layer 208 having a shallow junction structure is formed on the second epitaxial layer 205. A second P+ type high density doping layer 209b is formed in the second junction region 206. A third P+ type high density doping layer 209a divides the first N+ type high density doping layer 208. The first N+ type high density doping layer 208 is connected to a cathode electrode (not shown) and reduces the contact resistance of the cathode electrode. The second P+ type high density doping layer 209b is connected to first interconnecting structures 213a and 213b constituting an anode electrode and reduces the contact resistance of the cathode electrode. The third P+ type high density doping layer 209a divides a light-receiving unit of the photodiode. An oxide layer 220a and a nitride layer 220b form an anti-reflective coating (ARC) on the entire surface of the photodiode including the second epitaxial layer 205 of the light-receiving unit. The oxide layer 220a and the nitride layer 220b cover an interlayer insulating layer 212 in contact with the light-receiving unit, an intermetal insulating layer 214, and a portion of second interconnecting structures 215a and 215b. The oxide layer 220a and the nitride layer 220b function as an ARC in the light-receiving unit and as a passivation layer protecting layers beneath them.

As shown in FIG. 8, a buffer oxide layer 230 and a silicon nitride (SiN) layer 240 are formed on a portion of the P type second junction region 206 not included in the light-receiving unit of the photodiode. The SiN layer 240 functions as an etching blocking layer. The buffer oxide layer 230 and the SiN layer 240 are formed on the second epitaxial layer 205 of the light-receiving unit. However, the buffer oxide layer 230 and the SiN layer 240 are removed from the light-receiving unit in the process of manufacturing the photodiode.

FIGS. 9 through 19 are sectional views illustrating a method of manufacturing a photodiode according to an exemplary embodiment of the present invention.

Figure 9:
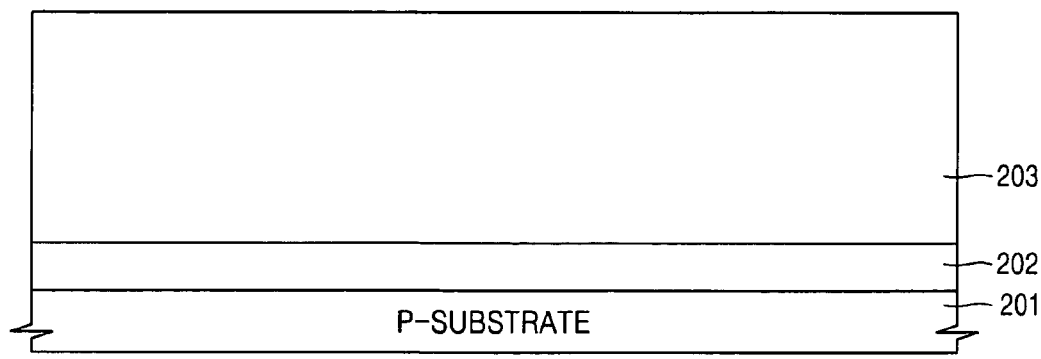
FIGS. 9 through 19 are sectional views illustrating a method of manufacturing a photodiode according to an exemplary embodiment of the present invention.
Figure 10:
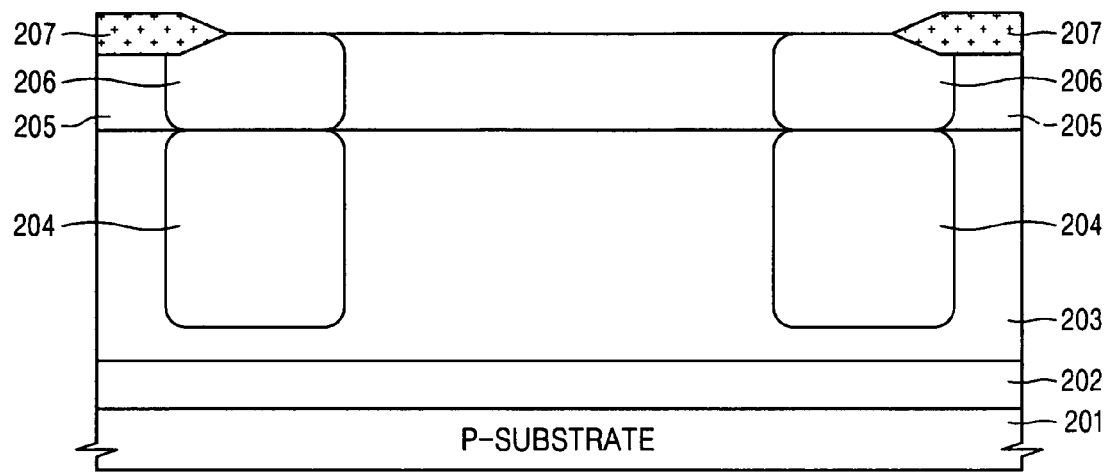

Referring to FIG. 9, a P type buried layer 202 and a P type first epitaxial layer 203 are sequentially formed on a P type semiconductor substrate 201. The thickness and resistivity of the first epitaxial layer 203 are important factors for assuring good photodiode performance. The first epitaxial layer should have a thickness of 8–12 µm and a resistivity of 100–200 Ωcm. Next, referring to FIG. 10, a P type first junction region 204 is formed in the first epitaxial layer 203 by ion implantation and thermal diffusion. An N type second epitaxial layer 205 is then formed on the first epitaxial layer 203. Then, a P type second junction region 206 is formed in the second epitaxial layer 205 through ion implantation and thermal diffusion. The P type second junction region 206 extends through the second epitaxial layer 205 to the first junction region 204. Then, a device isolating layer 207, such as local oxidation of silicon (LOCOS), is formed to isolate the photodiode from other elements.

Figure 11:
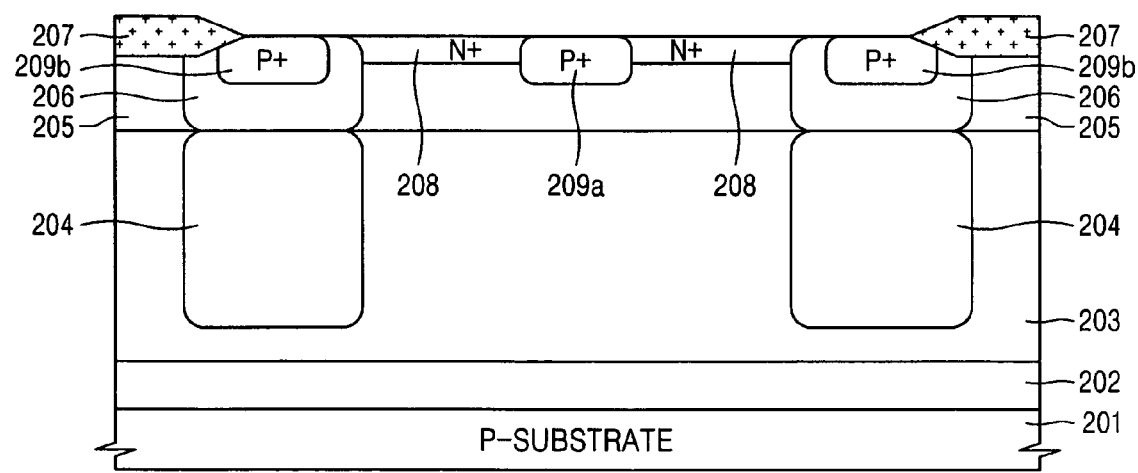

Next, referring to FIG. 11, a first N+ type high density doping layer 208 is formed on the N type second epitaxial layer 205. The first N+ type high density doping layer 208 is connected to a cathode electrode (not shown) for reducing a contact resistance of the cathode electrode. The first N+ type high density doping layer 208 may be formed with a shallow junction in order to improve the performance of the photodiode. Then, a second P+ type high density doping layer 209b is formed in the second junction region 206 and a third P+ type high density doping layer 209a is formed to divide the first N+ type high density doping layer 208. The second P+ type high density doping layer 209b reduces the contact resistance of the cathode electrode and the third P+ type high density doping layer 209a divides a light-receiving unit of the photodiode.

Figure 12:
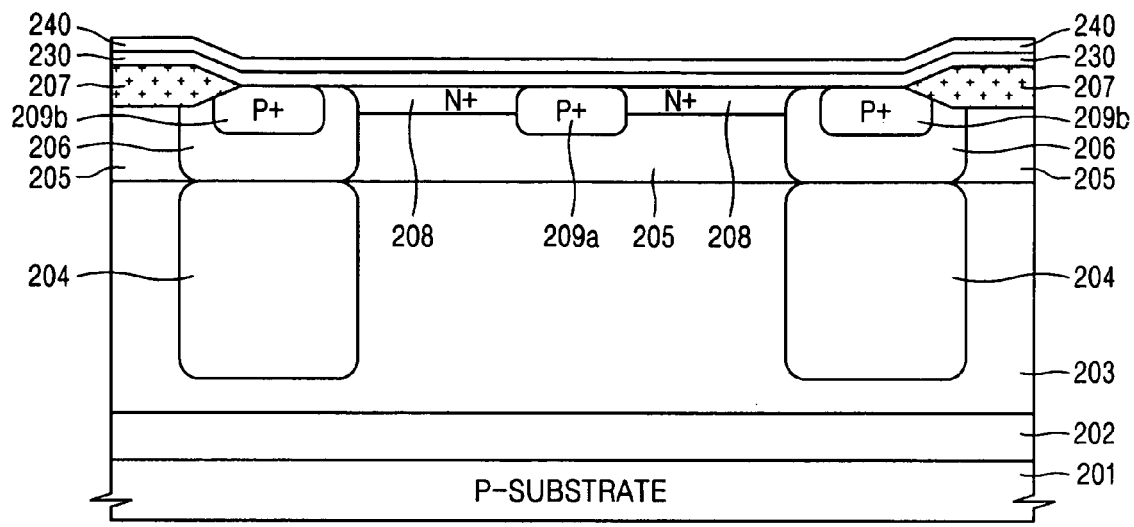

Then, referring to FIG. 12, a buffer oxide layer 230 and an etching blocking layer 240 are sequentially formed on the device isolating layer 207, the first N+ type high density doping layer 208, the third P+ type high density doping layer 209a, the second P+ type high density doping layer 209b, and the second junction region 206. The buffer oxide layer 230 may be a silicon oxide ($SiO_2$) layer having a thickness of 1000 Å. The etching blocking layer 240 may be composed of SiN and have a thickness of 4000 Å.

Figure 13:
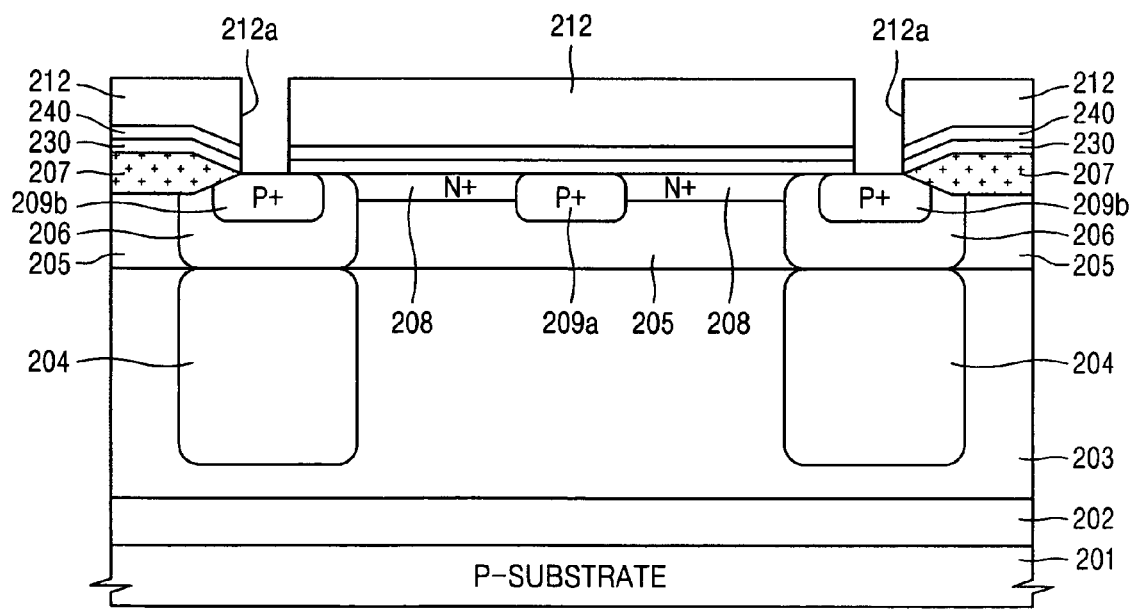

Next, referring to FIG. 13, an interlayer insulating layer 212 composed of an oxide is formed on the etching blocking layer 240. Contact holes 212a exposing a portion of the second high density doping layer 209b are formed in the buffer oxide layer 230, the etching blocking layer 240, and the interlayer insulating layer 212 by photo etching. The interlayer insulating layer 212 may be formed to a thickness of 12000 Å. The contact holes 212a are used to form a metal contact constituting an anode electrode in contact with the second high density doping layer 209b.

Figure 14:
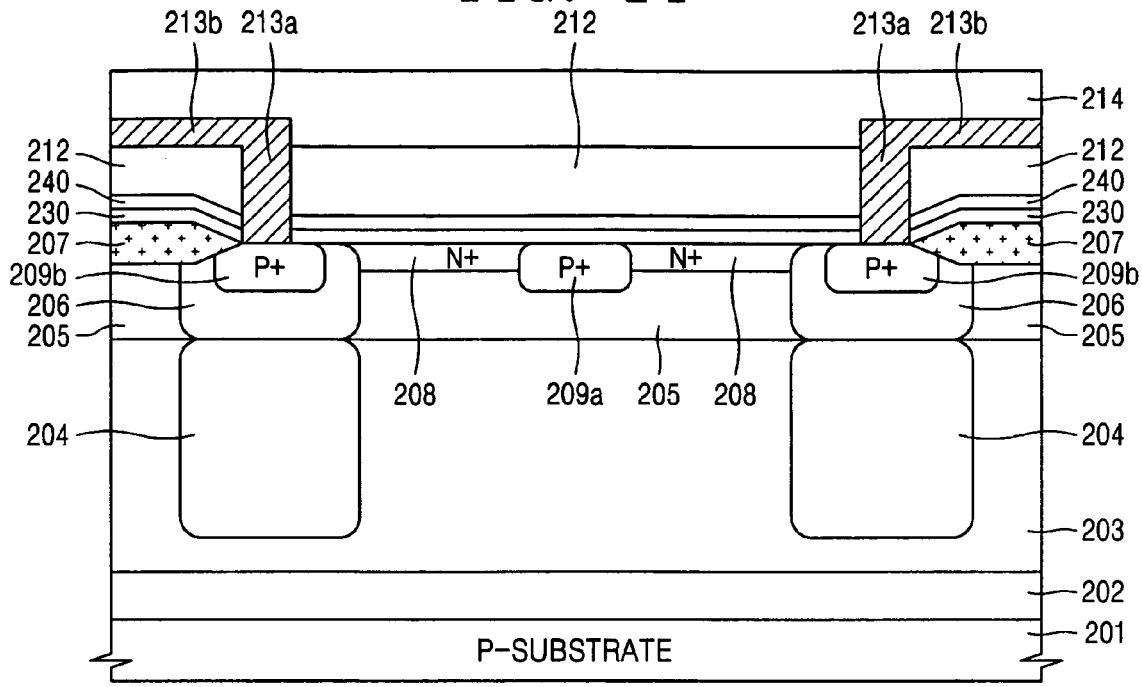

Then, referring to FIG. 14, a metal layer is deposited to completely bury the contact holes 212a. First metal interconnecting structures 213a and 213b, including a metal contact 213a and a metal interconnecting layer 213b, are formed by patterning the metal layer through photo etching. The first metal interconnecting structures 213a and 213b form an anode electrode by contacting the second P+ type high density doping layer 209b. A cathode electrode (not shown) in contact with the N+ type first high density doping layer 208 is formed after the first metal interconnecting structures 213a and 213b are formed. After the first metal interconnecting structures 213a and 213b are formed, an intermetal insulating layer 214 composed of an oxide is formed on the intermetal insulating layer 214 and the first metal interconnecting structures 213a and 213b. The intermetal insulating layer 214 may have a thickness of 8000–10000 Å.

Figure 15:
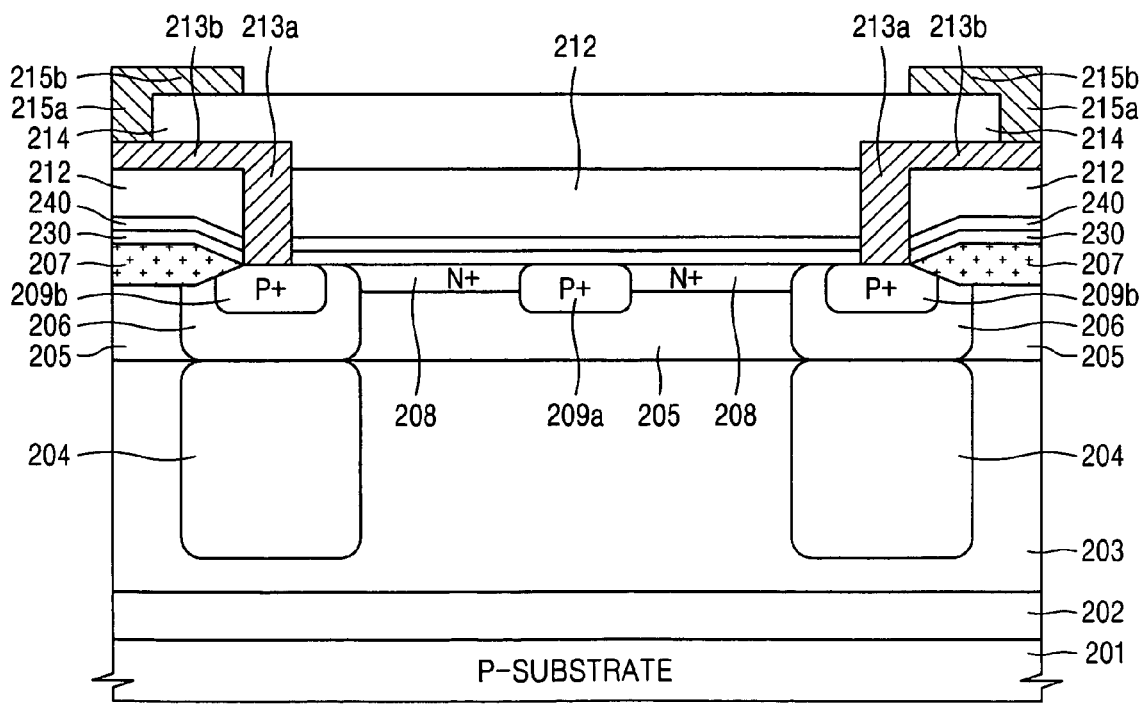

Next, referring to FIG. 15, a via hole is formed in the intermetal insulating layer 214 by photo etching. Then, a metal layer is deposited to bury the via hole. Second metal interconnecting structures 215a and 215b in contact with the first interconnecting layer 213b are formed by patterning the first metal layer through photo etching.

Figure 16:
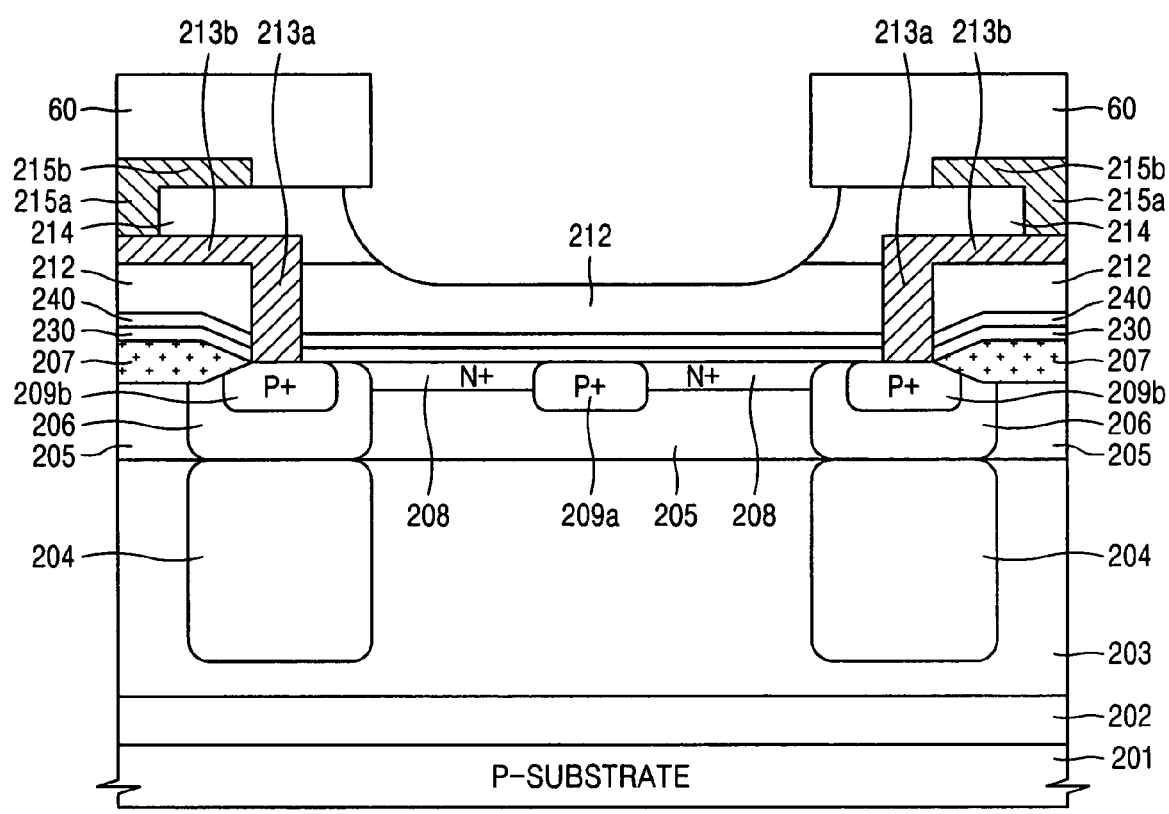
Figure 17:
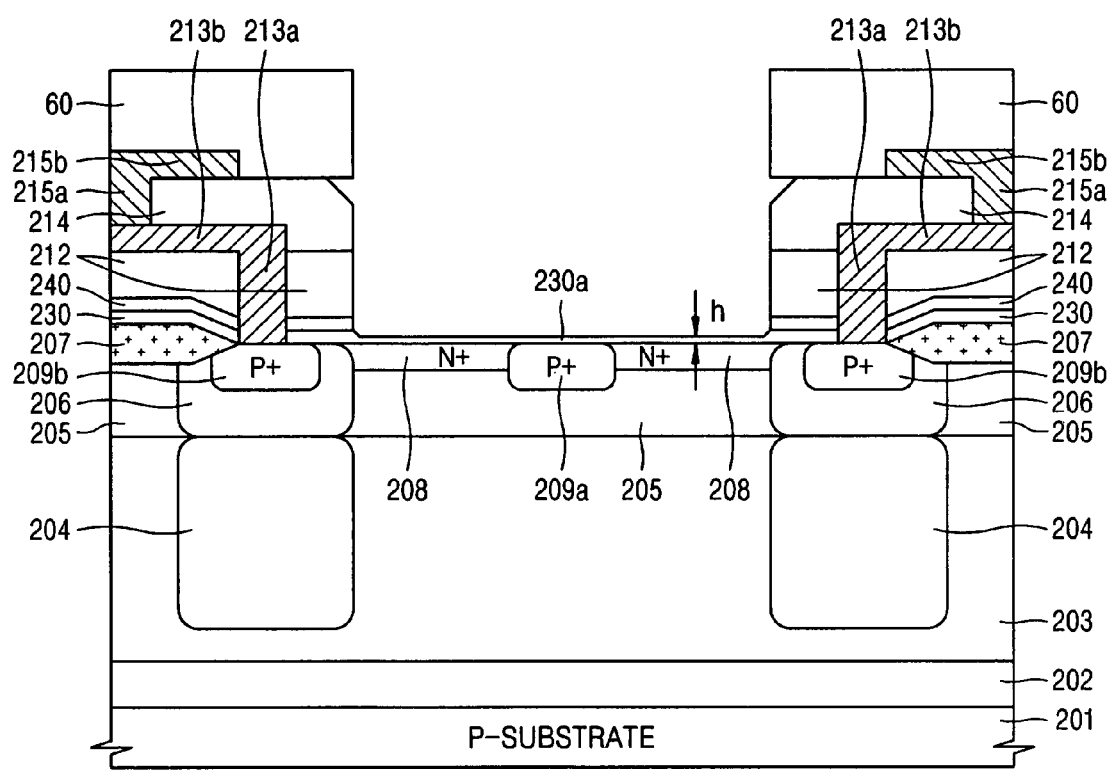
Figure 18:
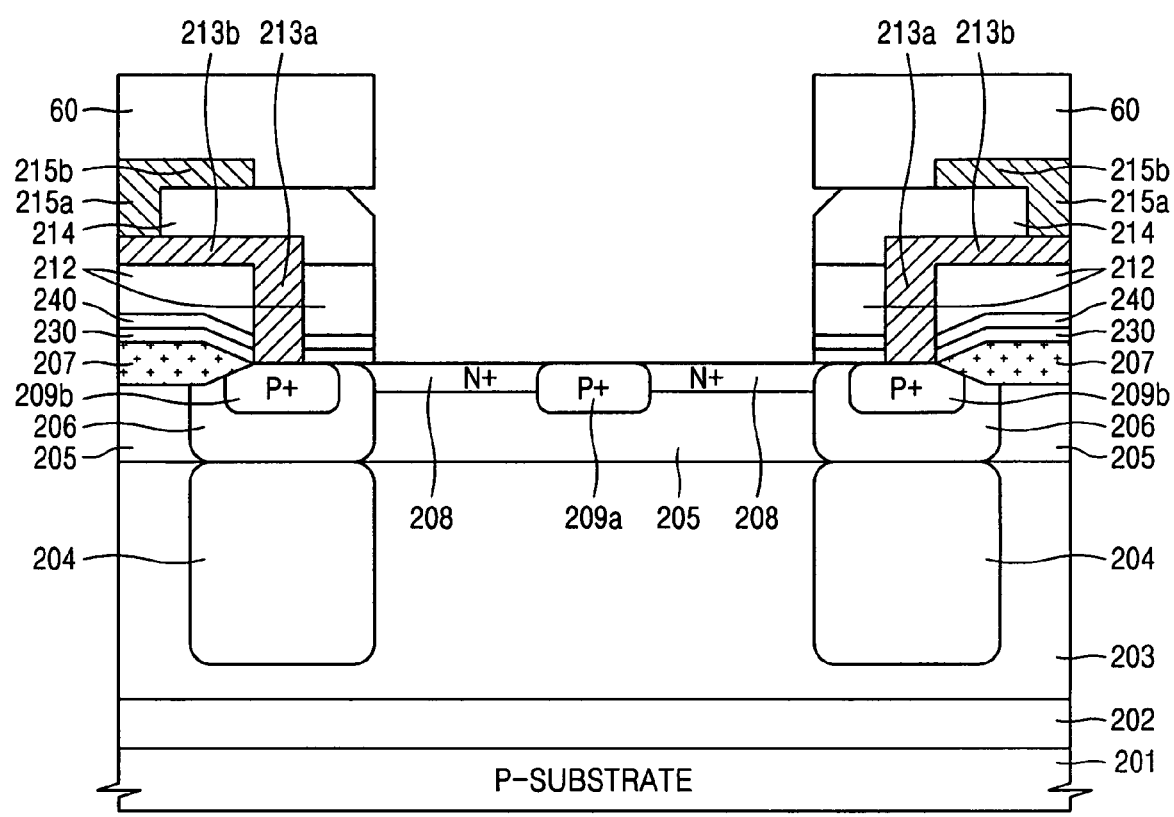

Next, referring to FIGS. 16 through 18, photo etching is performed to form a light-receiving unit of a photodiode. Then, a semiconductor surface is exposed in the light-receiving unit. First, referring to FIG. 16, a photo-resist pattern 60 exposing the light-receiving unit is formed on the intermetal insulating layer 214 and the second metal interconnecting structures 215a and 215b. Next, a portion of the intermetal insulating layer 214 and the interlayer insulating layer 212 is eliminated by wet etching using the photo-resist pattern 60 as an etching mask. A hydrogen fluoride (HF) solution or a buffered oxide etchant (BOE) may be used as an etchant.

Then, referring to FIG. 17, a portion of the remaining interlayer insulating layer 212, the etching blocking layer 240, and the buffer oxide layer 230 is removed by dry etching using the photo-resist pattern 60 as an etching mask and using the etch selectivity of $SiO_2$ with respect to SiN. That is, the etching blocking layer 240 composed of SiN is exposed by etching the remaining interlayer insulating layer 212 using an $O_2$ gas and some of the following mixed gases $CF_4$, $CHF_3$, $C_2F_6$, $C_3F_8$, $C_4F_8$, $CH_2F_2$, $CH_3F$, $C_4F_6$, or a compound of these in an Argon (Ar) atmosphere. In this process, the etching blocking layer 240 is not completely removed along with the interlayer insulating layer 212 due to the high etch selectivity of $SiO_2$ with respect to SiN. Next, a portion of the etching blocking layer 240 and the buffer oxide layer 230 is removed by time-controlled dry etching using the etching gas. When a portion of the etching blocking layer 240 and the buffer oxide layer 230 is removed, it is possible to reduce the etch selectivity of $SiO_2$ with respect to SiN by changing the composition of the $C_XF_Y$ group mixed gas. The thickness of the buffer oxide layer 230 remaining after the dry etching may be 50 Å. The dry etching is finished with a portion of the buffer oxide layer 230 remaining so as not to expose a semiconductor surface, thus preventing plasma from contacting the semiconductor surface.

Next, referring to FIG. 18, the buffer oxide layer 230 remaining in the light-receiving unit is removed by wet etching, thus exposing the semiconductor surface. Here, an HF solution or a BOE may be used as an etchant, and the use of wet etching instead of dry etching prevents damage to the semiconductor surface.

Figure 19:
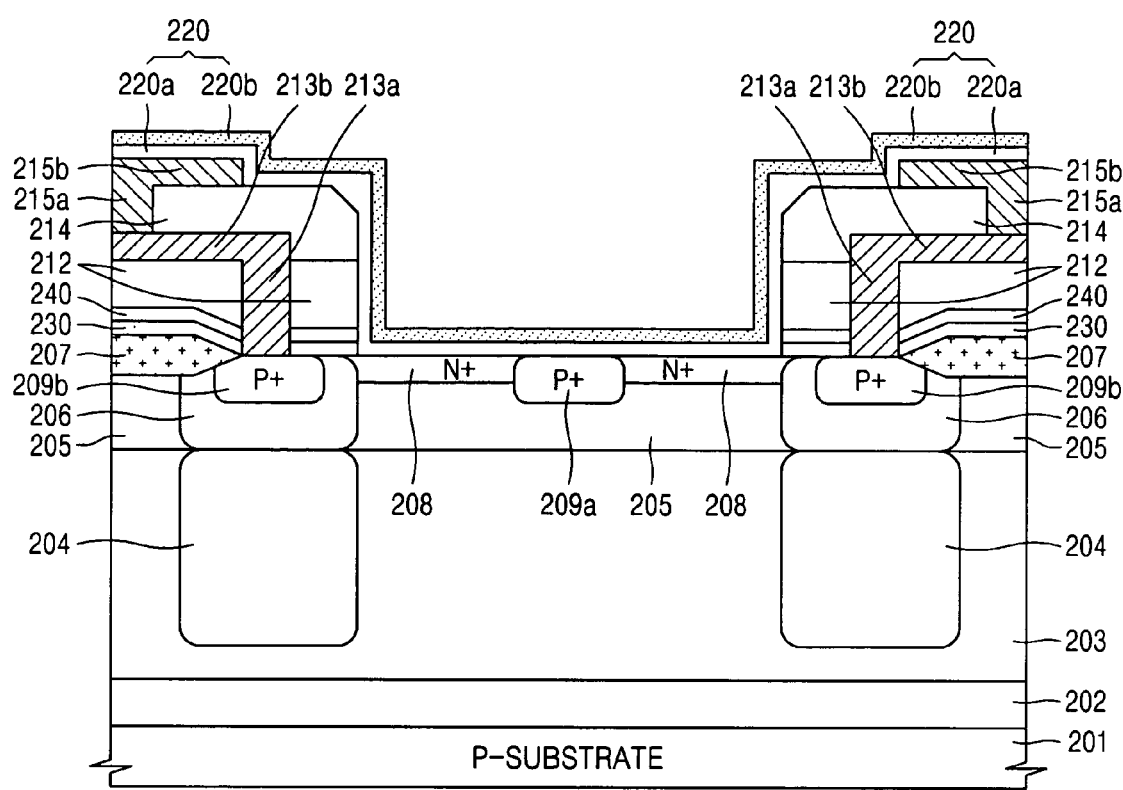

Then, referring to FIG. 19, an anti-reflective coating (ARC) 220 is formed on the entire surface of the resultant structure in order to improve the light absorption rate of the light-receiving unit. The ARC may be formed by sequentially forming an $SiO_2$ layer 220a and an SiN layer 220b. The $SiO_2$ layer 220a and the SiN layer 220b of the ARC 220 may be respectively deposited by plasma enhanced chemical vapor deposition (PECVD). The $SiO_2$ layer 220a and the SiN layer 220b function as an ARC in the light-receiving unit and as a passivation layer protecting layers beneath them. Therefore, the thicknesses of the $SiO_2$ layer 220a and the SiN layer 220b may be set for photoefficiency and passivation.

FIGS. 20 through 23 are sectional views illustrating a method of manufacturing a photodiode according to another exemplary embodiment of the present invention. This method is similar to the method as described in FIGS. 9–19 except that an intermetal insulating layer 214 and an interlayer insulating layer 212 for forming a light-receiving unit are dry etched instead of wet etched.

Figure 20:
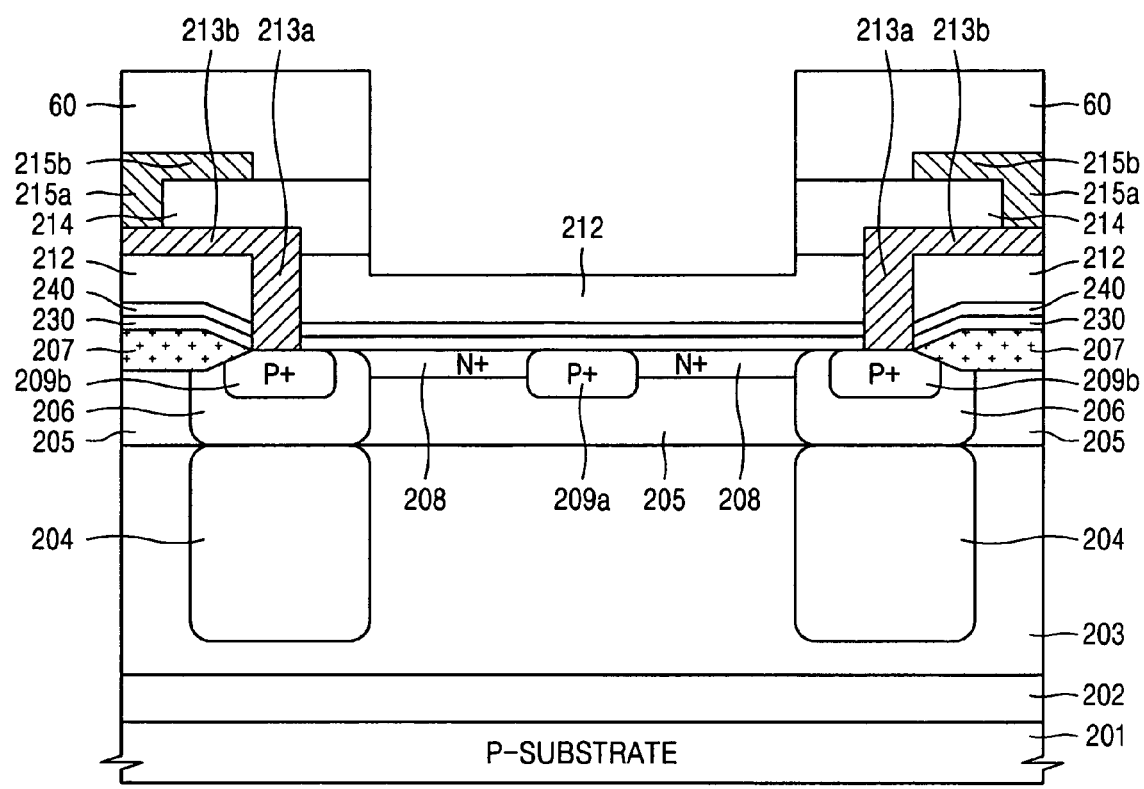
FIGS. 20 through 23 are sectional views illustrating a method of manufacturing a photodiode according to another exemplary embodiment of the present invention.

Next, referring to FIG. 20, a photo-resist pattern 60 exposing the light-receiving unit is formed. A portion of an intermetal insulating layer 214 and an interlayer insulating layer 212 is removed by dry etching using the photo-resist pattern 60 as an etching mask.

Figure 21:
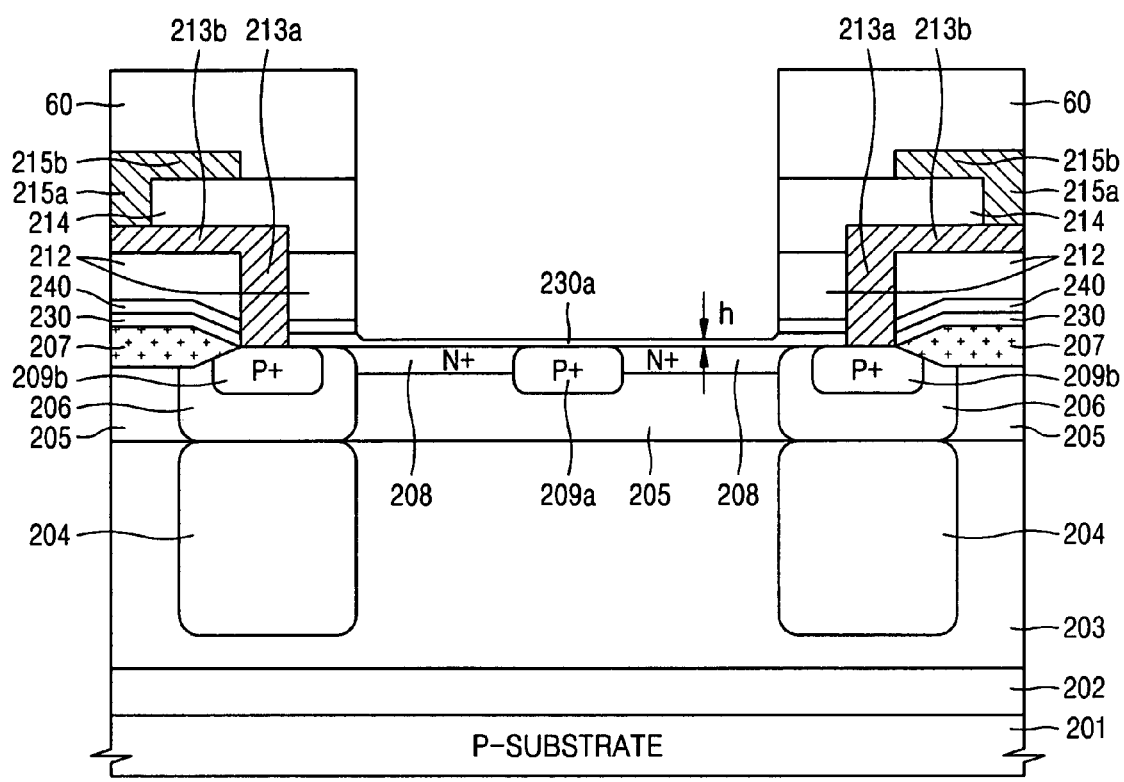

Referring to FIG. 21, after an etching blocking layer 240 composed of SiN is exposed by dry etching, a portion of the etching blocking layer 240 and a buffer oxide layer 230 is removed by time-controlled dry etching. A thickness h of the buffer oxide layer 230 remaining after the dry etching may be 50 Å.

Figure 22:
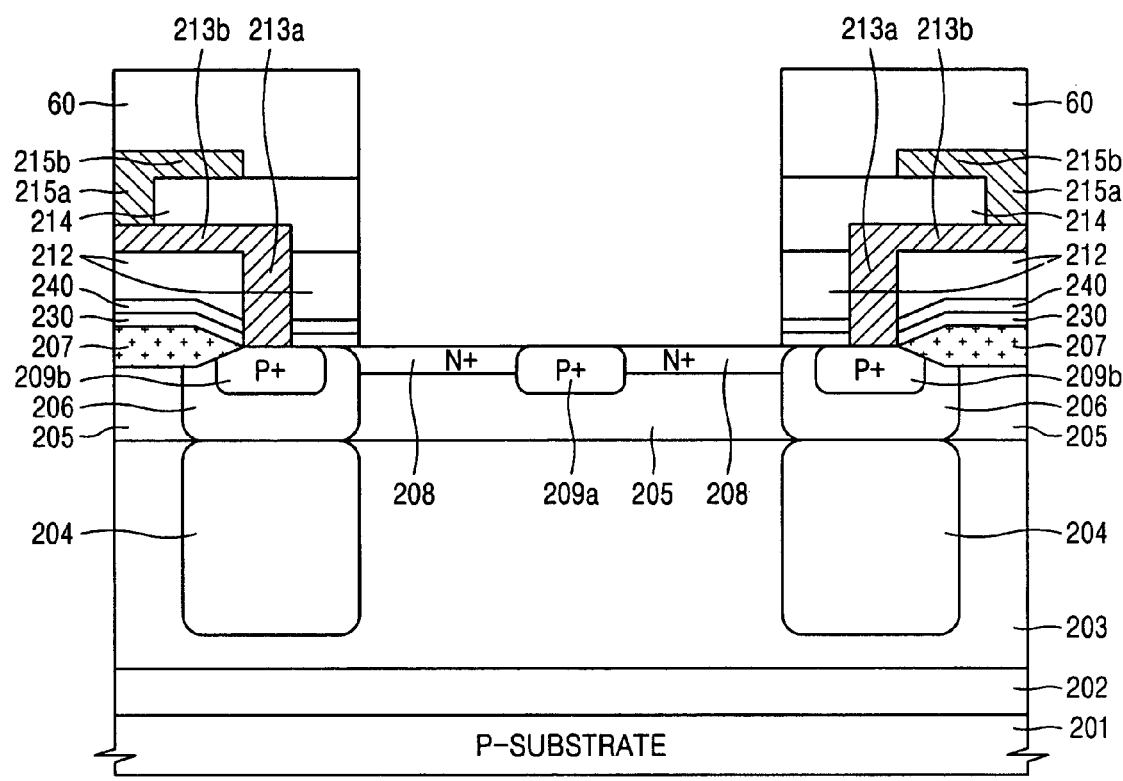
Figure 23:
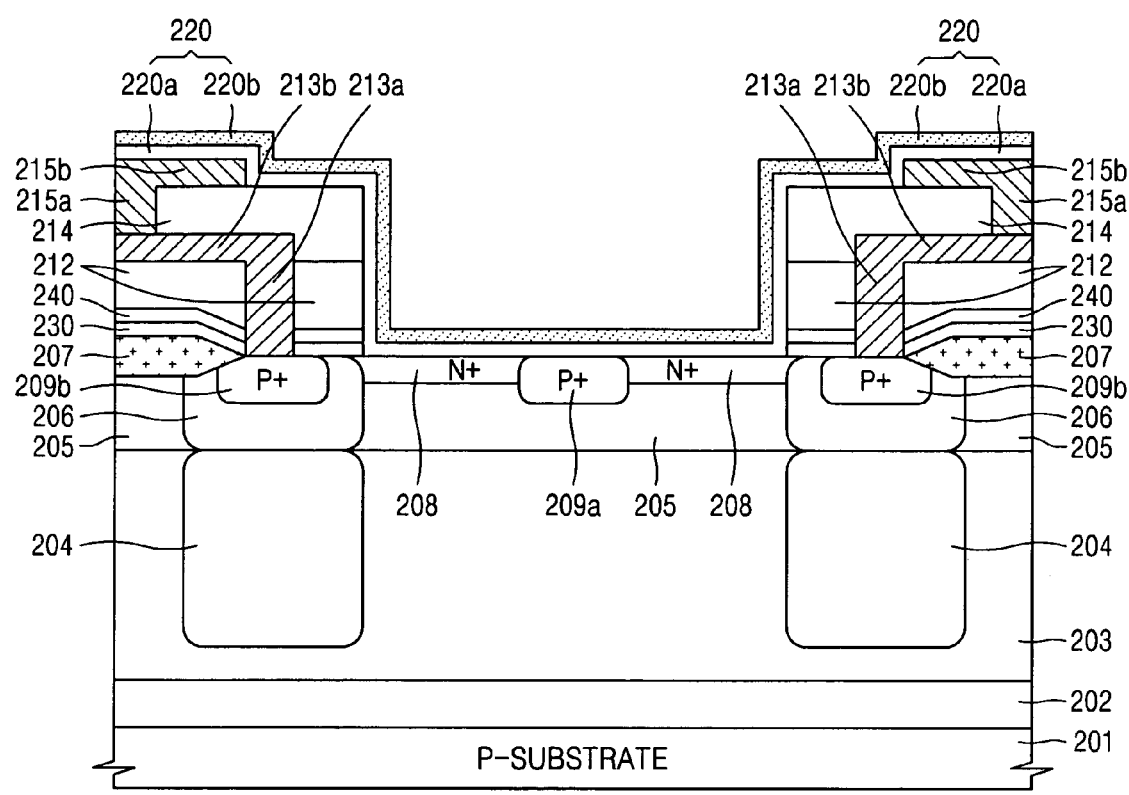

Then, referring to FIG. 22, a semiconductor surface is exposed by removing the remaining exposed buffer oxide layer 230 by wet etching using an HF solution or BOE. Then, referring to FIG. 23, an ARC 220 including any $SiO_2$ layer 220a and an SiN layer 220b is formed by PECVD on the entire surface of the resultant structure. Thus, it is possible to prevent damage to the semiconductor surface caused by dry etching because the semiconductor surface is exposed by wet etching.

According to the exemplary embodiments of the present invention, damage to a semiconductor surface may be prevented because the semiconductor surface is exposed by wet etching a buffer oxide layer remaining in a light-receiving layer after a portion of an etching blocking layer and the buffer oxide layer in the light-receiving unit is removed by dry etching. Thus, a leakage current of a photodiode may be reduced and accurate output signals may be obtained.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A photodiode comprising:
   a semiconductor substrate;
   a first conductive type buried layer on the semiconductor substrate;
   a first conductive type first epitaxial layer on the buried layer;
   a second conductive type second epitaxial layer on the first epitaxial layer;
   a first conductive type first junction region in the first epitaxial layer;
   a first conductive type second junction region in contact with the first junction region extending through the second epitaxial layer;
   a second conductive type first high density doping layer on the second epitaxial layer;
   a first conductive type second high density doping layer in the second junction region;
   an interlayer insulating layer on the second epitaxial layer;
   an intermetal insulating layer on the interlayer insulating layer;
   interconnecting structures in the interlayer insulating layer and the intermetal insulating layer in contact with the second high density doping layer;
   a buffer oxide layer on a portion of the second junction region outside a light-receiving unit;
   an etching blocking layer on the buffer oxide layer; and
   an anti-reflective coating (ARC) on the exposed semiconductor surface of the light-receiving unit, the intermetal insulating layer, and the interconnecting structures.

2. The photodiode of claim 1, wherein the buffer oxide layer is composed of silicon oxide ($SiO_2$) and the etching blocking layer is composed of silicon nitride (SiN).

3. The photodiode of claim 1, wherein the ARC is formed by depositing $SiO_2$ and SiN on the exposed semiconductor surface.

4. The photodiode of claim 1, further comprising:
   a device isolating layer for isolating the photodiode.

5. The photodiode of claim 1, further comprising:
   a first conductive type third high density doping layer on the upper part of the second epitaxial layer for dividing the light-receiving unit of the photodiode.

6. The photodiode of claim 1, wherein the first high density doping layer has a shallow junction depth.

7. The photodiode of claim 1, wherein the first epitaxial layer has a thickness of 8–12 μm.

8. The photodiode of claim 1, wherein the first epitaxial layer has a resistivity of 100–200 Ωcm.

* * * * *